United States Patent
Miura et al.

(10) Patent No.: US 7,372,675 B2
(45) Date of Patent: May 13, 2008

(54) MAGNETORESISTIVE ELEMENT, THIN-FILM MAGNETIC HEAD, HEAD GIMBAL ASSEMBLY, HEAD ARM ASSEMBLY AND MAGNETIC DISK DRIVE

(75) Inventors: Satoshi Miura, Tokyo (JP); Takumi Uesugi, Tokyo (JP); Norio Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 391 days.

(21) Appl. No.: 11/253,757

(22) Filed: Oct. 20, 2005

(65) Prior Publication Data

US 2006/0092579 A1 May 4, 2006

(30) Foreign Application Priority Data

Nov. 2, 2004 (JP) ............................. 2004-319254

(51) Int. Cl.
*G11B 5/39* (2006.01)
(52) U.S. Cl. .............................. 360/324.2; 360/324.11; 360/324.12
(58) Field of Classification Search ........... 360/324.11, 360/324.12, 324.2
See application file for complete search history.

(56) References Cited

U.S. PATENT DOCUMENTS 6,329,078 B1   12/2001   Tsuge
6,661,626 B2 * 12/2003   Gill ........................... 360/324.2
6,747,852 B2 *  6/2004   Lin et al. ................ 360/324.12
6,831,816 B2 * 12/2004   Gill ........................ 360/324.12
7,256,971 B2 *  8/2007   Horng et al. ........... 360/324.11
2003/0086217 A1 * 5/2003  Pinarbasi ............... 360/324.12
2003/0103299 A1 * 6/2003  Saito ..................... 360/324.12

FOREIGN PATENT DOCUMENTS

JP        B 3050189        3/2000
JP        A 2001-68757     3/2001
JP          2006196892 A  * 7/2006

\* cited by examiner

*Primary Examiner*—Tianjie Chen
(74) *Attorney, Agent, or Firm*—Oliff & Berridge, PLC

(57) ABSTRACT

An MR element comprises: a tunnel barrier layer having two surfaces that face toward opposite directions; a free layer disposed adjacent to one of the surfaces of the tunnel barrier layer and having a direction of magnetization that changes in response to an external magnetic field; and a pinned layer that is a ferromagnetic layer disposed adjacent to the other of the surfaces of the tunnel barrier layer and having a fixed direction of magnetization. The free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers.

11 Claims, 7 Drawing Sheets

US 7,372,675 B2

MAGNETORESISTIVE ELEMENT, THIN-FILM MAGNETIC HEAD, HEAD GIMBAL ASSEMBLY, HEAD ARM ASSEMBLY AND MAGNETIC DISK DRIVE

BACKGROUND OF THE INVENTION

1. Field of the Invention

The present invention relates to a magnetoresistive element utilizing a tunnel magnetoresistive effect, and to a thin-film magnetic head, a head gimbal assembly, a head arm assembly and a magnetic disk drive each of which incorporates the magnetoresistive element.

2. Description of the Related Art

Improvements in performance of thin-film magnetic heads have been sought as areal recording density of magnetic disk drives has increased. A widely used type of thin-film magnetic head is a composite thin-film magnetic head that has a structure in which a write (recording) head having an induction-type electromagnetic transducer for writing and a read (reproducing) head having a magnetoresistive (MR) element for reading are stacked on a substrate.

MR elements include: anisotropic magnetoresistive (AMR) elements utilizing an anisotropic magnetoresistive effect; giant magnetoresistive (GMR) elements utilizing a giant magnetoresistive effect; and tunnel magnetoresistive (TMR) elements utilizing a tunnel magnetoresistive effect.

It is required that the characteristics of a read head include high sensitivity and high output capability. GMR heads incorporating spin-valve GMR elements have been mass-produced as read heads that satisfy such requirements. Recently, developments in read heads using TMR elements have been sought to respond to further improvements in areal recording density.

Typically, a TMR element incorporates: a tunnel barrier layer having two surfaces facing toward opposite directions; a free layer disposed adjacent to one of the surfaces of the tunnel barrier layer; a pinned layer disposed adjacent to the other of the surfaces of the tunnel barrier layer; and an antiferromagnetic layer disposed adjacent to one of two surfaces of the pinned layer farther from the tunnel barrier layer. The tunnel barrier layer is a nonmagnetic insulating layer through which electrons are capable of passing while maintaining spins thereof by means of the tunnel effect. The free layer is a ferromagnetic layer in which the direction of magnetization changes in response to a signal magnetic field. The pinned layer is a ferromagnetic layer in which the direction of magnetization is fixed. The antiferromagnetic layer is a layer that fixes the direction of magnetization in the pinned layer by means of exchange coupling with the pinned layer.

In the TMR element, the direction of magnetization in the free layer changes in response to the signal magnetic field sent from a recording medium, and accordingly, the relative angle between the direction of magnetization in the free layer and the direction of magnetization in the pinned layer changes. If the relative angle changes, the rate of electrons passing through the tunnel barrier layer while maintaining the spins thereof changes, and as a result, the resistance of the TMR element changes. It is possible to read data stored on the recording medium by detecting the change in resistance of the TMR element.

In the TMR element, theoretically, the ratio of magnetoresistive change to the resistance (hereinafter referred to as MR ratio) is expressed by:

$$2P_1P_2/(1-P_1P_2)$$

where $P_1$ and $P_2$ represent the spin polarizations of the free layer and the pinned layer, respectively. Therefore, the higher the spin polarizations $P_1$ and $P_2$, the higher is the MR ratio.

In view of this, to achieve a higher MR ratio in the TMR element, it would be useful to employ a ferromagnetic material having a high spin polarization as the material of the free layer and the pinned layer. However, the following problem arises if the free layer is made of a ferromagnetic material having a high spin polarization. Typical ferromagnetic materials having a high spin polarization include an alloy containing Co and Fe, and an alloy containing Ni and Fe wherein the proportion of Fe is higher. If such a ferromagnetic material is used as the material of the free layer, the soft magnetic property of the free layer deteriorates while a high MR ratio can be obtained. To be specific, deterioration of soft magnetic property means an increase in coercive force. To use a TMR element for a read head, it is required that the TMR element should have a high MR ratio and a high magnetic field sensitivity (magnetoresistive change/external magnetic field change). If the soft magnetic property of the free layer deteriorates as mentioned above, the magnetic field sensitivity of the TMR element is lowered and output signals of the TMR element tend to become unstable.

To solve the above-mentioned problem, Japanese Patent No. 3050189 B2 discloses a technique in which the free layer is made up of two layers, one of which is a high polarization layer that is in contact with the tunnel barrier layer and the other of which is a soft magnetic layer that is disposed such that the high polarization layer is sandwiched between the soft magnetic layer and the tunnel barrier layer.

According to the technique disclosed in the above-mentioned Japanese Patent, however, increasing the MR ratio of the TMR element causes an increase in the coercive force of the free layer, and reducing the coercive force of the free layer causes a reduction in the MR ratio of the TMR element. It is thus difficult to achieve both of a higher MR ratio of the TMR element and a lower coercive force of the free layer.

OBJECT AND SUMMARY OF THE INVENTION

It is an object of the present invention to provide a magnetoresistive element utilizing a tunnel magnetoresistive effect that achieves both of a higher MR ratio and a lower coercive force of the free layer, and to provide a thin-film magnetic head, a head gimbal assembly, a head arm assembly and a magnetic disk drive each of which incorporates the magnetoresistive element.

A magnetoresistive element of the invention comprises: a tunnel barrier layer having two surfaces that face toward opposite directions; a free layer disposed adjacent to one of the surfaces of the tunnel barrier layer and having a direction of magnetization that changes in response to an external magnetic field; and a pinned layer that is a ferromagnetic layer disposed adjacent to the other of the surfaces of the tunnel barrier layer and having a fixed direction of magnetization.

In the magnetoresistive element of the invention, the free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers. The high polarization layer is a ferromagnetic layer having a spin polarization higher than that of each of the first and second soft magnetic layers. Each of the first and second soft magnetic layers is a ferromagnetic layer having a coercive force lower than that of the high polarization layer.

According to the magnetoresistive element of the invention, it is possible to achieve a higher MR ratio and a lower coercive force of the free layer because of the free layer incorporating the first soft magnetic layer, the high polarization layer and the second soft magnetic layer.

In the magnetoresistive element of the invention, the high polarization layer may be made of any one of iron (Fe), an alloy containing iron, and an alloy containing iron and cobalt (Co). The high polarization layer may be made of an alloy containing M atomic % iron and (100−M) atomic % cobalt, where M is equal to or greater than 40 and smaller than 100.

In the magnetoresistive element of the invention, each of the first and second soft magnetic layers may be made of any one of nickel (Ni), iron, and an alloy containing at least one of nickel and iron. Each of the first and second soft magnetic layers may have a coercive force of 5×79.6 A/m or less.

In the magnetoresistive element of the invention, the first soft magnetic layer may have a thickness that is not smaller than 0.2 nm and not greater than 5 nm. It is preferable that the thickness of the first soft magnetic layer be not smaller than 0.2 nm and not greater than 3 nm.

A thin-film magnetic head of the invention comprises: a medium facing surface that faces toward a recording medium; and the magnetoresistive element of the invention disposed near the medium facing surface for detecting a signal magnetic field sent from the recording medium.

A head gimbal assembly of the invention comprises: a slider incorporating the thin-film magnetic head of the invention and disposed to face toward the recording medium; and a suspension that flexibly supports the slider.

A head arm assembly of the invention comprises: a slider incorporating the thin-film magnetic head of the invention and disposed to face toward the recording medium; a suspension that flexibly supports the slider; and an arm for moving the slider in a direction across tracks of the recording medium, the suspension being attached to the arm.

A magnetic disk drive of the invention comprises: a slider incorporating the thin-film magnetic head of the invention and disposed to face toward a circular-plate-shaped recording medium that is rotated and driven; and an alignment device that supports the slider and aligns the slider with respect to the recording medium.

According to the magnetoresistive element, the thin-film magnetic head, the head gimbal assembly, the head arm assembly and the magnetic disk drive of the invention, it is possible to achieve a higher MR ratio of the magnetoresistive element and a lower coercive force of the free layer of the magnetoresistive element because of the free layer incorporating the first soft magnetic layer, the high polarization layer and the second soft magnetic layer.

Other and further objects, features and advantages of the invention will appear more fully from the following description.

DETAILED DESCRIPTION OF PREFERRED EMBODIMENT

Figure 2:
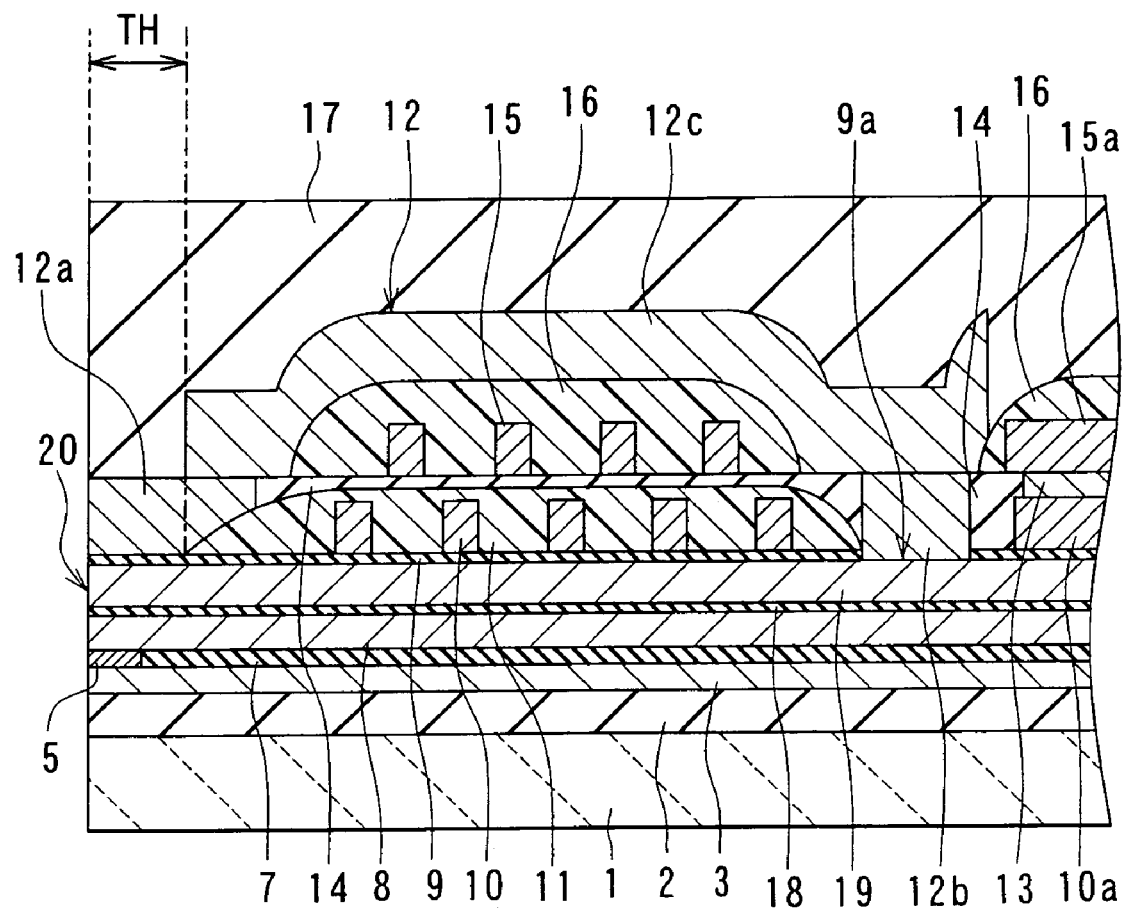
FIG. 2 is a cross-sectional view of a thin-film magnetic head of the embodiment of the invention orthogonal to the air bearing surface and the substrate.
Figure 3:
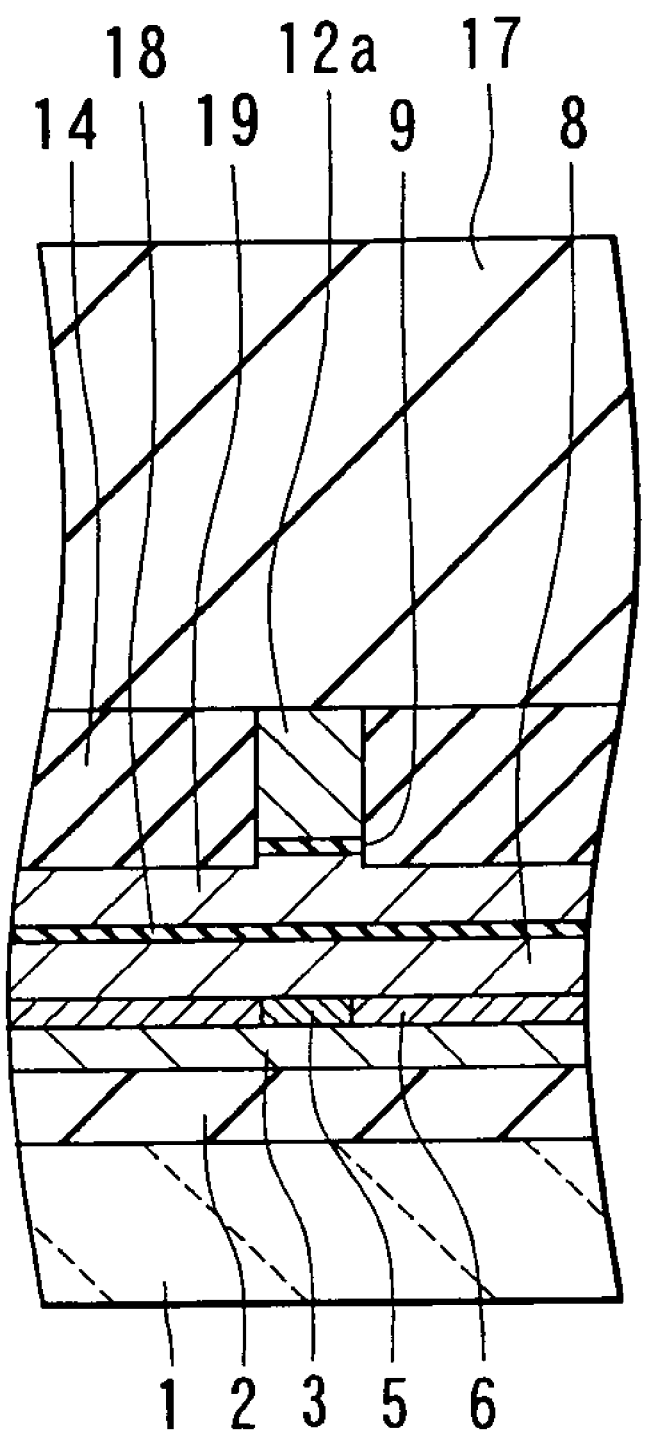
FIG. 3 is a cross-sectional view of a pole portion of the thin-film magnetic head of the embodiment of the invention parallel to the air bearing surface.

A preferred embodiment of the invention will now be described in detail with reference to the accompanying drawings. Reference is now made to FIG. 2 and FIG. 3 to describe the outlines of the configuration and a manufacturing method for a thin-film magnetic head of the embodiment of the invention. FIG. 2 shows a cross section of the thin-film magnetic head orthogonal to the air bearing surface and the substrate. FIG. 3 shows a cross section of a pole portion of the thin-film magnetic head parallel to the air bearing surface.

In the method of manufacturing the thin-film magnetic head of the embodiment, first, an insulating layer 2 made of an insulating material such as alumina ($Al_2O_3$) is formed to have a thickness of 1 to 5 μm, for example, by a method such as sputtering on a substrate 1 made of a ceramic material such as aluminum oxide and titanium carbide ($Al_2O_3$—TiC). Next, a first shield layer 3 provided for a read head and made of a magnetic material such as NiFe or FeAlSi is formed to have a specific pattern on the insulating layer 2 by a method such as plating. Next, although not shown, an insulating layer of alumina, for example, is formed over the entire surface. Next, the insulating layer is polished by chemical mechanical polishing (hereinafter referred to as CMP), for example, so that the first shield layer 3 is exposed, and the top surfaces of the first shield layer 3 and the insulating layer are thereby flattened.

Next, an MR element 5 for reading, two bias field applying layers 6 and an insulating layer 7 are formed on the first shield layer 3. The bias field applying layers 6 are disposed adjacent to two sides of the MR element 5, respectively. The insulating layer 7 is disposed around the MR element 5 and the bias field applying layers 6. The insulating layer 7 is made of an insulating material such as alumina.

Next, a second shield layer 8 for the read head is formed on the MR element 5, the bias field applying layers 6 and the insulating layer 7. The second shield layer 8 is made of a magnetic material and may be formed by plating or sputtering, for example. Next, a separating layer 18 made of a nonmagnetic material such as alumina is formed by sputtering, for example, on the second shield layer 8. Next, a bottom pole layer 19 provided for a write head and made of a magnetic material is formed on the separating layer 18 by plating or sputtering, for example. The magnetic material used for the second shield layer 8 and the bottom pole layer 19 is a soft magnetic material such as NiFe, CoFe, CoFeNi or FeN. Alternatively, a second shield layer that also functions as a bottom pole layer may be provided in place of the second shield layer 8, the separating layer 18 and the bottom pole layer 19.

Next, a write gap layer 9 made of a nonmagnetic material such as alumina is formed to have a thickness of 50 to 300 nm, for example, on the bottom pole layer 19 by a method such as sputtering. Next, to make a magnetic path, a portion of the write gap layer 9 is etched to form a contact hole 9a in a center portion of a thin-film coil described later.

Next, a first layer portion 10 of the thin-film coil made of copper (Cu), for example, is formed to have a thickness of 2 to 3 µm, for example, on the write gap layer 9. In FIG. 2, numeral 10a indicates a connecting portion of the first layer portion 10 connected to a second layer portion 15 of the thin-film coil described later. The first layer portion 10 is wound around the contact hole 9a.

Next, an insulating layer 11 having a specific pattern is formed to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is performed at a specific temperature to flatten the surface of the insulating layer 11. Through this heat treatment, each of the outer and inner edge portions of the insulating layer 11 is made to have a shape of rounded sloped surface.

Next, a track width defining layer 12a of a top pole layer 12 made of a magnetic material for the write head is formed on regions of the write gap layer 9 and the insulating layer 11, the regions extending from a sloped portion of the insulating layer 11 closer to an air bearing surface 20 described later toward the air bearing surface 20. The top pole layer 12 is made up of the track width defining layer 12a, and a coupling portion layer 12b and a yoke portion layer 12c that will be described later.

The track width defining layer 12a has: a tip portion that is formed on the write gap layer 9 and that functions as the pole portion of the top pole layer 12; and a connecting portion that is formed on the sloped portion of the insulating layer 11 closer to the air bearing surface 20 and is connected to the yoke portion layer 12c. The tip portion has a width equal to the write track width. The connecting portion has a width greater than that of the tip portion.

When the track width defining layer 12a is formed, the coupling portion layer 12b made of a magnetic material is formed in the contact hole 9a, and a connecting layer 13 made of a magnetic material is formed on the connecting portion 10a at the same time. The coupling portion layer 12b makes up a portion of the top pole layer 12 that is magnetically coupled to the bottom pole layer 19.

Next, pole trimming is performed. That is, in a region around the track width defining layer 12a, the write gap layer 9 and at least a portion of the pole portion of the bottom pole layer 19 close to the write gap layer 9 are etched by using the track width defining layer 12a as a mask. As a result, as shown in FIG. 3, a trim structure is formed, wherein the pole portion of the top pole layer 12, the write gap layer 9 and at least a portion of the pole portion of the bottom pole layer 19 have equal widths. The trim structure has an effect of preventing an increase in effective track width resulting from an expansion of magnetic flux near the write gap layer 9.

Next, an insulating layer 14 made of an inorganic insulating material such as alumina is formed to have a thickness of 3 to 4 µm, for example, over the entire surface. The insulating layer 14 is then polished by CMP, for example, to reach the surfaces of the track width defining layer 12a, the coupling portion layer 12b and the connecting layer 13, and flattened.

Next, the second layer portion 15 of the thin-film coil made of copper (Cu), for example, is formed to have a thickness of 2 to 3 µm, for example, on the flattened insulating layer 14. In FIG. 2, numeral 15a indicates a connecting portion of the second layer portion 15 connected to the connecting portion 10a of the first layer portion 10 of the thin-film coil through the connecting layer 13. The second layer portion 15 is wound around the coupling portion layer 12b.

Next, an insulating layer 16 having a specific pattern is formed to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is performed at a specific temperature to flatten the surface of the insulating layer 16. Through this heat treatment, each of the outer and inner edge portions of the insulating layer 16 is made to have a shape of rounded sloped surface.

Next, the yoke portion layer 12c made of a magnetic material for the write head such as Permalloy is formed on the track width defining layer 12a, the insulating layers 14 and 16, and the coupling portion layer 12b. The yoke portion layer 12c makes up a yoke portion of the top pole layer 12. An end of the yoke portion layer 12c closer to the air bearing surface 20 is located at a distance from the air bearing surface 20. The yoke portion layer 12c is connected to the bottom pole layer 19 through the coupling portion layer 12b.

Next, an overcoat layer 17 made of alumina, for example, is formed to cover the entire surface. Finally, machining of the slider including the foregoing layers is performed to form the air bearing surface 20 of the thin-film magnetic head including the write head and the read head. The thin-film magnetic head is thus completed.

The thin-film magnetic head thus manufactured comprises the air bearing surface 20 as the medium facing surface that faces toward a recording medium, the read head and the write head. The configuration of the read head will be described in detail later.

The write head incorporates the bottom pole layer 19 and the top pole layer 12 that are magnetically coupled to each other and include the pole portions that are opposed to each other and placed in regions on a side of the air bearing surface 20. The write head further incorporates: the write gap layer 9 provided between the pole portion of the bottom pole layer 19 and the pole portion of the top pole layer 12; and the thin-film coil including the portions 10 and 15 at least part of which is placed between the bottom pole layer 19 and the top pole layer 12 and insulated from the bottom pole layer 19 and the top pole layer 12. In the thin-film magnetic head, as shown in FIG. 2, the length from the air bearing surface 20 to the end of the insulating layer 11 closer to the air bearing surface 20 is throat height TH. Throat height means the length (height) from the air bearing surface 20 to a point at which the distance between the two pole layers starts to increase.

Figure 1:
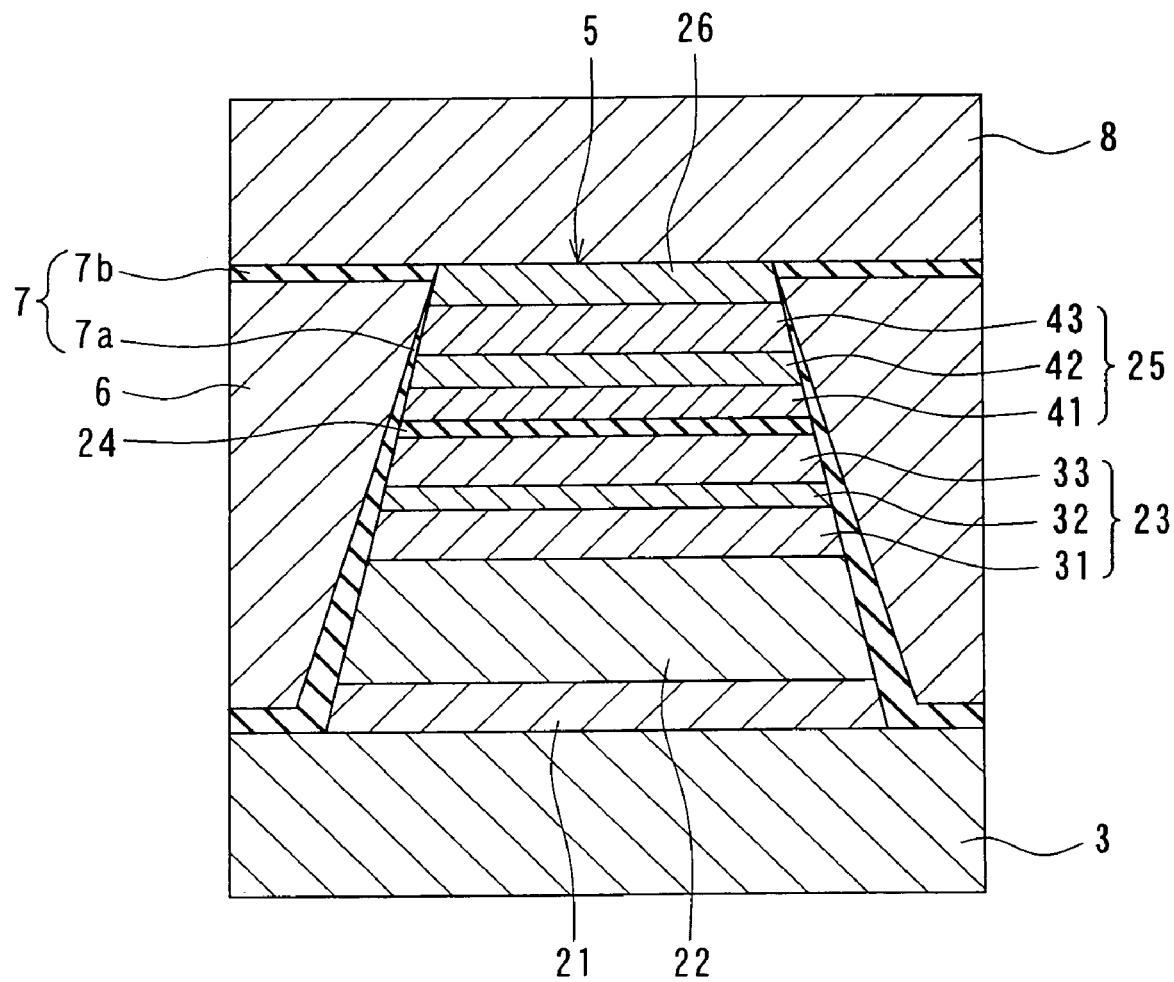
FIG. 1 is a cross-sectional view of a read head of an embodiment of the invention parallel to the air bearing surface.

Reference is now made to FIG. 1 to describe the details of the configuration of the read head of the embodiment. FIG. 1 shows a cross section of the read head parallel to the air bearing surface. As shown in FIG. 1, the read head comprises the first shield layer 3 and the second shield layer 8 disposed at a specific distance from each other, and the MR element 5 disposed between the first shield layer 3 and the second shield layer 8. The MR element 5 and the second shield layer 8 are stacked on the first shield layer 3.

The read head further comprises: the two bias field applying layers 6 that are disposed adjacent to the two sides of the MR element 5 and apply a bias magnetic field to the MR element 5; and the insulating layer 7 disposed around the MR element 5 and the bias field applying layers 6. The bias field applying layers 6 are each made of a hard magnetic layer (a hard magnet) or made using a layered structure made up of a ferromagnetic layer and an antiferromagnetic layer, for example. The insulating layer 7 incorporates insulating films 7a and 7b. The insulating film 7a is disposed between the first shield layer 3 and the bias field applying layers 6, and between the MR element 5 and the bias field applying layers 6, to provide insulation therebetween. The insulating film 7b is disposed between the second shield layer 8 and the bias field applying layers 6 to provide insulation therebetween.

The MR element 5 is a TMR element that utilizes a tunnel magnetoresistive effect. The MR element 5 has a resistance that changes in response to an external magnetic field, that is, a signal magnetic field sent from a recording medium. The first and second shield layers 3 and 8 are used to feed a sense current to the MR element 5. The sense current is a current for detecting magnetic signals and flows in a direction perpendicular to planes of the layers making up the MR element 5. The resistance of the MR element 5 is determined from the sense current. It is thus possible to read data stored on the recording medium by using the read head.

FIG. 1 illustrates an example of configuration of the MR element 5. This MR element 5 comprises: a tunnel barrier layer 24 having two surfaces that face toward opposite directions; a free layer 25 disposed adjacent to one of the surfaces of the tunnel barrier layer 24 and having a direction of magnetization that changes in response to the external magnetic field; and a pinned layer 23 that is a ferromagnetic layer disposed adjacent to the other of the surfaces of the tunnel barrier layer 24 and having a fixed direction of magnetization. In the example shown in FIG. 1, the pinned layer 23 is disposed closer to the first shield layer 3 than the free layer 25. Alternatively, it is possible that the free layer 25 be disposed closer to the first shield layer 3 than the pinned layer 23. The MR element 5 further comprises: an antiferromagnetic layer 22 disposed such that the pinned layer 23 is sandwiched between the antiferromagnetic layer 22 and the tunnel barrier layer 24; an underlying layer 21 disposed between the first shield layer 3 and the antiferromagetic layer 22; and a protection layer 26 disposed between the free layer 25 and the second shield layer 8. In the MR element 5 shown in FIG. 1, the underlying layer 21, the antiferromagnetic layer 22, the pinned layer 23, the tunnel barrier layer 24, the free layer 25 and the protection layer 26 are stacked in this order on the first shield layer 3.

The antiferromagnetic layer 22 is a layer that fixes the direction of magnetization in the pinned layer 23 by means of exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The protection layer 26 is a layer for protecting the layers located therebelow.

The underlying layer 21 has a thickness of 2 to 6 nm, for example. The underlying layer 21 may have a layered structure made up of a Ta layer and any one of a NiCr layer, a NiFe layer and a NiFeCr layer, for example.

The antiferromagnetic layer 22 has a thickness of 5 to 30 nm, for example, and may be made of an antiferromagnetic material including Mn and at least one element $M_{II}$ selected from the group consisting of Pt, Ru, Rh, Pd, Ni, Cu, Ir, Cr and Fe. The proportion of Mn in the material preferably falls within a range of 35 to 95 atomic % inclusive. The proportion of the other element $M_{II}$ preferably falls within a range of 5 to 65 atomic % inclusive. One type of antiferromagnetic material is a non-heat-induced antiferromagnetic material that exhibits antiferromagnetism without any heat treatment and that induces an exchange coupling magnetic field between a ferromagnetic material and itself. Another type of antiferromagnetic material is a heat-induced antiferromagnetic material that exhibits antiferromagnetism when heat treatment is given. The antiferromagnetic layer 22 may be made of either of these types.

The non-heat-induced antiferromagnetic materials include a Mn alloy that has a γ phase, such as RuRhMn, FeMn, and IrMn. The heat-induced antiferromagnetic materials include a Mn alloy that has a regular crystal structure, such as PtMn, NiMn, and PtRhMn.

The direction of magnetization in the pinned layer 23 is fixed by means of the exchange coupling at the interface between the antiferromagnetic layer 22 and the pinned layer 23. The pinned layer 23 is made up of, for example, a first ferromagnetic layer 31, a coupling layer 32 and a second ferromagnetic layer 33 that are stacked in this order on the antiferromagnetic layer 22. Each of the first and second ferromagnetic layers 31 and 33 is made of a ferromagnetic material including at least Co selected from the group consisting of Co and Fe, for example. In particular, it is preferred that the (111) plane of this ferromagnetic material be oriented along the direction in which the layers are stacked. The total thickness of the two ferromagnetic layers 31 and 33 is 1.5 to 5 nm, for example. The two ferromagnetic layers 31 and 33 are antiferromagnetic-coupled to each other and the directions of magnetization thereof are fixed to opposite directions.

The coupling layer 32 of the pinned layer 23 has a thickness of 0.2 to 1.2 nm, for example, and may be made of a nonmagnetic material including at least one element selected from the group consisting of Ru, Rh, Ir, Re, Cr, Zr and Cu. The coupling layer 32 is provided for creating antiferromagnetic exchange coupling between the first and second ferromagnetic layers 31 and 33, and for fixing the magnetizations of the first and second ferromagnetic layers 31 and 33 to opposite directions. The magnetizations of the first and second ferromagnetic layers 31 and 33 in opposite directions include not only the case in which there is a difference of 180 degrees between these directions of magnetizations, but also the case in which there is a difference of 180±20 degrees between them.

The tunnel barrier layer 24 is a nonmagnetic insulating layer through which electrons are capable of passing while maintaining spins thereof by means of the tunnel effect. The tunnel barrier layer 24 has a thickness of 0.5 to 2 nm, for example, and is made of an oxide or nitride of any one of Al, Ni, Gd, Mg, Ta, Mo, Ti, W, Hf and Zr, for example.

The free layer 25 incorporates: a first soft magnetic layer 41 disposed adjacent to the one of the two surfaces of the tunnel barrier layer 24; a high polarization layer 42 disposed such that the first soft magnetic layer 41 is sandwiched between the tunnel barrier layer 24 and the high polarization layer 42; and a second soft magnetic layer 43 disposed such that the high polarization layer 42 is sandwiched between the first and second soft magnetic layers 41 and 43. The high polarization layer 42 is a ferromagnetic layer having a spin polarization higher than that of each of the first and second soft magnetic layers 41 and 43. Each of the first and second soft magnetic layers 41 and 43 is a ferromagnetic layer having a coercive force lower than that of the high polarization layer 42.

The high polarization layer 42 is made of any one of Fe, an alloy containing Fe, an alloy containing Fe and Co, and an alloy containing Fe, Co and Ni, for example. The high polarization layer 42 may be made of an FeCo alloy containing M atomic % Fe and (100−M) atomic % Co, where M is equal to or greater than 40 and smaller than 100. When an FeCo alloy is employed as the material of the high polarization layer 42, making the proportion of Fe equal to or higher than 40 atomic % and lower than 100 atomic % can greatly increase the MR ratio of the MR element 5, compared with a case in which the proportion of Fe is equal to or higher than 0 atomic % and lower than 40 atomic %. M is preferably not smaller than 50. The high polarization layer 42 has a thickness of 0.5 to 3 nm, for example.

Each of the first and second soft magnetic layers 41 and 43 is made of any one of Ni, Fe, and an alloy containing at least one of Ni and Fe, for example. Each of the first and second soft magnetic layers 41 and 43 has a coercive force that is preferably not higher than 5 Oe (5×79.6 A/m), and more preferably not higher than 1 Oe (1×79.6 A/m). While it is preferred that the coercive force of each of the first and second soft magnetic layers 41 and 43 be as low as possible, that is, as close to zero as possible, it may have a practical value of 0.1 Oe (0.1×79.6 A/m) or greater.

The first soft magnetic layer 41 has a thickness that is preferably not smaller than 0.2 nm and not greater than 5 nm, and more preferably not smaller than 0.2 nm and not greater than 3 nm. The reason will be described later. The second soft magnetic layer 43 has a thickness of 0.5 to 5 nm, for example.

The protection layer 26 has a thickness of 0.5 to 10 nm, for example, and may be made of Ta. The protection layer 26 may have a two-layer structure made up of a Ta layer and a Ru layer, for example, or may have a three-layer structure made up of Ta/Ru/Ta layers or Ru/Ta/Ru layers, for example.

A method of manufacturing the read head shown in FIG. 1 will now be described. In the method, first, the first shield layer 3 having a specific pattern is formed on the insulating layer 2 by plating, for example. Next, films to be the layers making up the MR element 5 are formed one by one on the first shield layer 3 by sputtering, for example. Next, the films are patterned by etching to form the MR element 5. The insulating film 7a, the bias field applying layers 6, and the insulating film 7b are then formed in this order by sputtering, for example. Next, the second shield layer 8 is formed by plating or sputtering, for example, on the MR element 5 and the insulating film 7b.

The functions of the MR element 5 and the thin-film magnetic head of the embodiment will now be described. The thin-film magnetic head writes data on a recording medium by using the write head and reads data written on the recording medium by using the read head.

In the read head, the direction of the bias magnetic field produced by the bias field applying layers 6 intersects the direction orthogonal to the air bearing surface 20 at a right angle. In the MR element 5, the direction of magnetization of the free layer 25 is aligned with the direction of the bias magnetic field when no signal magnetic field exists. The direction of magnetization of the pinned layer 23 is fixed to the direction orthogonal to the air bearing surface 20.

In the MR element 5, the direction of magnetization of the free layer 25 changes in response to the signal magnetic field sent from the recording medium. The relative angle between the direction of magnetization of the free layer 25 and the direction of magnetization of the pinned layer 23 is thereby changed. As a result, the resistance of the MR element 5 changes. The resistance of the MR element 5 is determined from the potential difference between the first and second shield layers 3 and 8 when a sense current is fed to the MR element 5 from the shield layers 3 and 8. It is thus possible to read data stored on the recording medium by using the read head.

In the MR element 5 of the embodiment, the free layer 25 incorporates the first soft magnetic layer 41, the high polarization layer 42 and the second soft magnetic layer 43. Since the high polarization layer 42 has a spin polarization higher than that of each of the first and second soft magnetic layers 41 and 43, the MR element 5 achieves a higher MR ratio, compared with an MR element that does not include the high polarization layer 42. Furthermore, since the first and second soft magnetic layers 41 and 43 that are lower in coercive force than the high polarization layer 42 are disposed to sandwich the high polarization layer 42, it is possible to make the coercive force of the free layer 25 lower, compared with a case in which the free layer is made up of a high polarization layer alone.

According to the MR element 5 of the embodiment, it is possible to greatly reduce the coercive force of the free layer 25 while suppressing a reduction in the MR ratio, compared with a case in which the free layer is made up of two layers one of which is a high polarization layer that is in contact with the tunnel barrier layer and the other of which is a soft magnetic layer that is disposed such that the high polarization layer is sandwiched between the tunnel barrier layer and the soft magnetic layer.

The foregoing features of the embodiment make it possible to increase the MR ratio of the MR element 5 and to reduce the coercive force of the free layer 25. According to the embodiment, the MR element 5 thus achieves a high MR ratio, a high magnetic field sensitivity and stable output signals.

Results of first and second experiments performed to confirm the effects of the MR element 5 of the embodiment will now be described. In the first experiment, MR ratio and coercive force were determined for five samples, that is, MR elements of first to third examples of the embodiment and MR elements of first and second comparative examples. These five samples are different only in details of the free layer.

In each of the samples, the layers making up the MR element other than the free layer have the following details. The underlying layer has a layered structure made up of a 5-nm-thick Ta layer and a 2-nm-thick NiFe layer. The antiferromagnetic layer is a 15-nm-thick PtMn layer. The pinned layer has a layered structure made up of a 2-nm-thick FeCo layer, a 0.8-nm-thick Ru layer and a 3-nm-thick FeCo layer. The tunnel barrier layer is a 1-nm-thick layer of an Al oxide. The protection layer is a 10-nm-thick Ta layer.

In the first experiment, the following three types of materials were used for layers making up the free layer: NiFe (82 atomic % Ni and 18 atomic % Fe); FeCo (10 atomic % Fe and 90 atomic % Co); and FeCo (50 atomic % Fe and 50 atomic % Co). These materials are hereinafter expressed as $Ni_{82}Fe_{18}$, $Fe_{10}Co_{90}$, and $Fe^{50}Co_{50}$, respectively.

The free layer of each of the first and second comparative examples is made up of a first layer that is in contact with the tunnel barrier layer and a second layer that is disposed such that the first layer is sandwiched between the tunnel barrier layer and the second layer. The following table lists the materials and thicknesses of the first and second layers of the comparative examples.

TABLE 1

| Sample | 1st layer | 2nd layer |
| --- | --- | --- |
| 1st comparative example | $Fe_{10}Co_{90}$ 1.5 nm | $Ni_{82}Fe_{18}$ 3.0 nm |
| 2nd comparative example | $Fe_{50}Co_{50}$ 2.0 nm | $Ni_{82}Fe_{18}$ 3.0 nm |

The free layer of each of the first to third examples of the embodiment is made up of the first soft magnetic layer, the high polarization layer and the second soft magnetic layer. The following table lists the materials and thicknesses of those three layers of the first to third examples of the embodiment.

TABLE 2

| Sample | 1st soft magnetic layer | High polarization layer | 2nd soft magnetic layer |
| --- | --- | --- | --- |
| 1st example of embodiment | $Ni_{82}Fe_{18}$ 0.5 nm | $Fe_{50}Co_{50}$ 2.0 nm | $Ni_{82}Fe_{18}$ 3.0 nm |
| 2nd example of embodiment | $Ni_{82}Fe_{18}$ 1.0 nm | $Fe_{50}Co_{50}$ 2.0 nm | $Ni_{82}Fe_{18}$ 3.0 nm |
| 3rd example of embodiment | $Ni_{82}Fe_{18}$ 3.0 nm | $Fe_{50}Co_{50}$ 2.0 nm | $Ni_{82}Fe_{18}$ 3.0 nm |

The following is a comparison among $Ni_{82}Fe_{18}$, $Fe_{10}Co_{90}$ and $Fe_{50}Co_{50}$ used in the first experiment in terms of coercive force. The coercive force of $Fe_{50}Co_{50}$ is the highest, that of $Ni_{82}Fe_{18}$ is the lowest, and that of $Fe_{10}Co_{90}$ is lower than that of $Fe_{50}Co_{50}$ and higher than that of $Ni_{82}Fe_{18}$. Specifically, the coercive forces of $Ni_{82}Fe_{18}$, $Fe_{10}Co_{90}$, and $Fe_{50}Co_{50}$ are on the orders of several oersteds (1 oersted=79.6 A/m), several tens of oersteds, and 50 to 100 oersteds, respectively.

The following is a comparison among $Ni_{82}Fe_{18}$, $Fe_{10}Co_{90}$ and $Fe_{50}Co_{50}$ in terms of spin polarization. The spin polarization of $Fe_{50}Co_{50}$ is the highest, that of $Ni_{82}Fe_{18}$ is the lowest, and that of $Fe_{10}Co_{90}$ is lower than that of $Fe_{50}Co_{50}$ and higher than that of $Ni_{82}Fe_{18}$. It is difficult to identify specific values of spin polarization because spin polarization varies depending on the measurement method, film thickness and film-forming method. However, the above-described relationship is obtained if the spin polarizations of $Ni_{82}Fe_{18}$, $Fe_{10}Co_{90}$ and $Fe_{50}Co50$ are compared under the same conditions.

Figure 8:
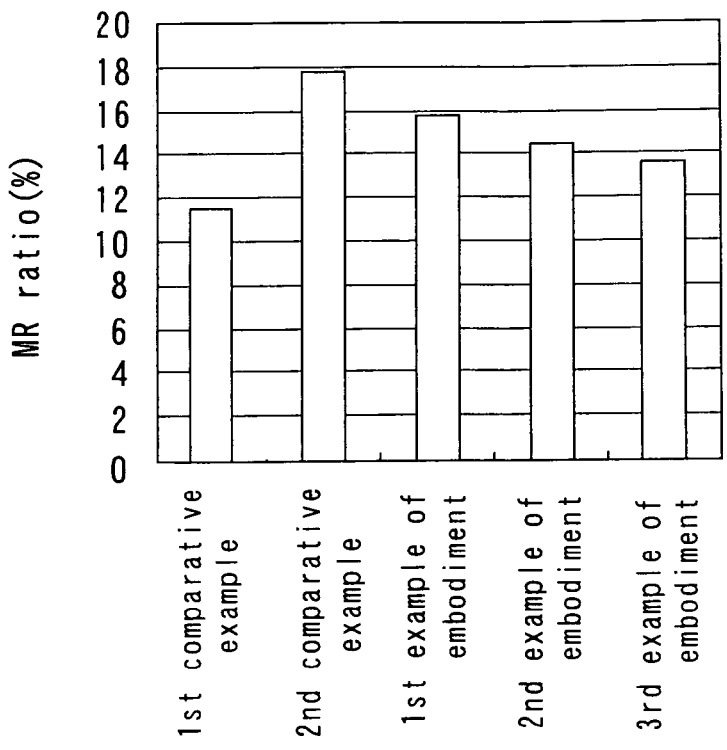
FIG. 8 is a plot showing the results of a first experiment performed to confirm the effects of an MR element of the embodiment of the invention.
Figure 9:
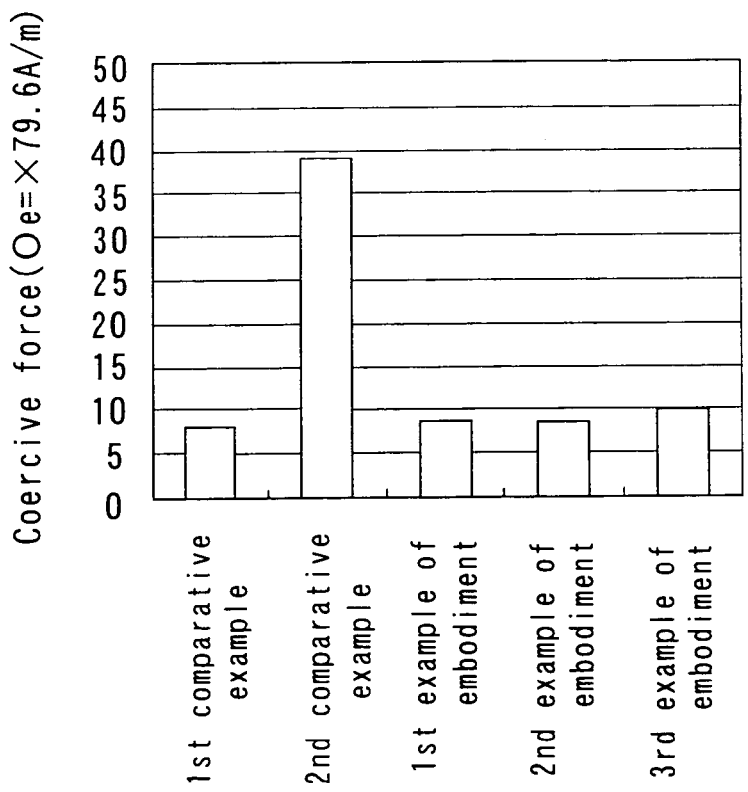
FIG. 9 is a plot showing the results of the first experiment performed to confirm the effects of the MR element of the embodiment of the invention.

The following table shows the MR ratio and the coercive force of the free layer of each of the five samples obtained in the experiment. FIG. 8 illustrates the MR ratios of the five samples. FIG. 9 illustrates the coercive forces of the free layers of the five samples.

TABLE 3

| Sample | MR ratio (%) | Coercive force [Oe (×79.6 A/m)] |
| --- | --- | --- |
| 1st comparative example | 11.5 | 8 |
| 2nd comparative example | 17.8 | 39 |
| 1st example of embodiment | 15.7 | 9 |
| 2nd example of embodiment | 14.5 | 8 |
| 3rd example of embodiment | 13.7 | 10 |

If comparison is made between the first and second comparative examples in terms of MR ratio, it is noted that use of $Fe_{50}Co_{50}$ having a high spin polarization as the material of the first layer of the free layer greatly increases the MR ratio, compared with the case of using $Fe_{10}Co_{90}$ that is lower in spin polarization than $Fe_{50}Co_{50}$. However, if comparison is made between the first and second comparative examples in terms of coercive force of the free layer, it is noted that use of $Fe_{50}Co_{50}$ as the material of the first layer of the free layer also causes a great increase in coercive force of the free layer.

In contrast, according to the first to third examples of the embodiment, it is possible to achieve a great reduction in coercive force of the free layer while suppressing a reduction in MR ratio, compared with the second comparative example. Furthermore, according to the first to third examples of the embodiment, it is possible to increase the MR ratio while making the coercive force almost as low as the first comparative example. The results of the first experiment show that, according to the embodiment of the invention, it is possible to achieve both of a higher MR ratio of the MR element 5 and a lower coercive force of the free layer 25.

Figure 10:
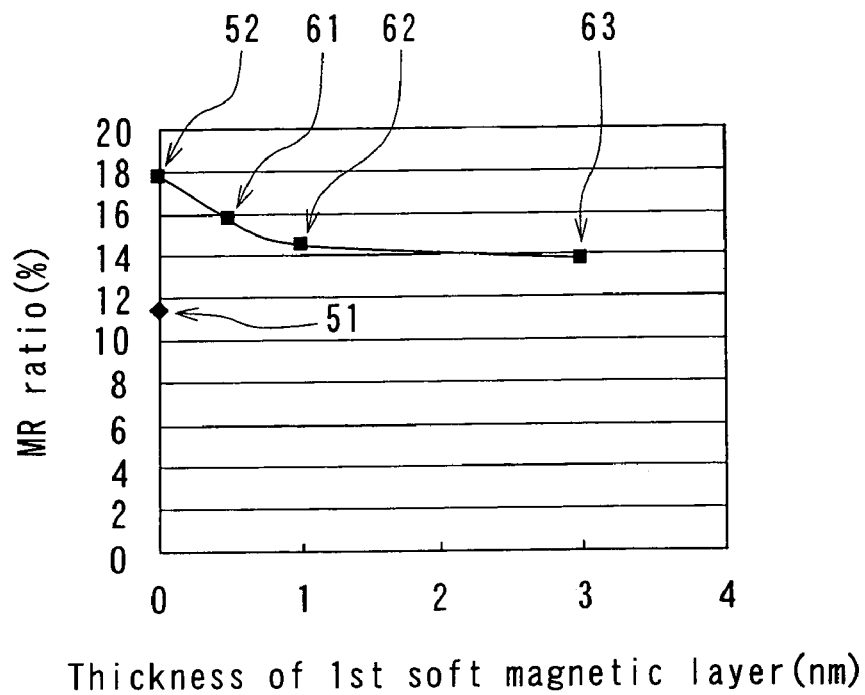
FIG. 10 is a plot showing the results of the first experiment performed to confirm the effects of the MR element of the embodiment of the invention.
Figure 11:
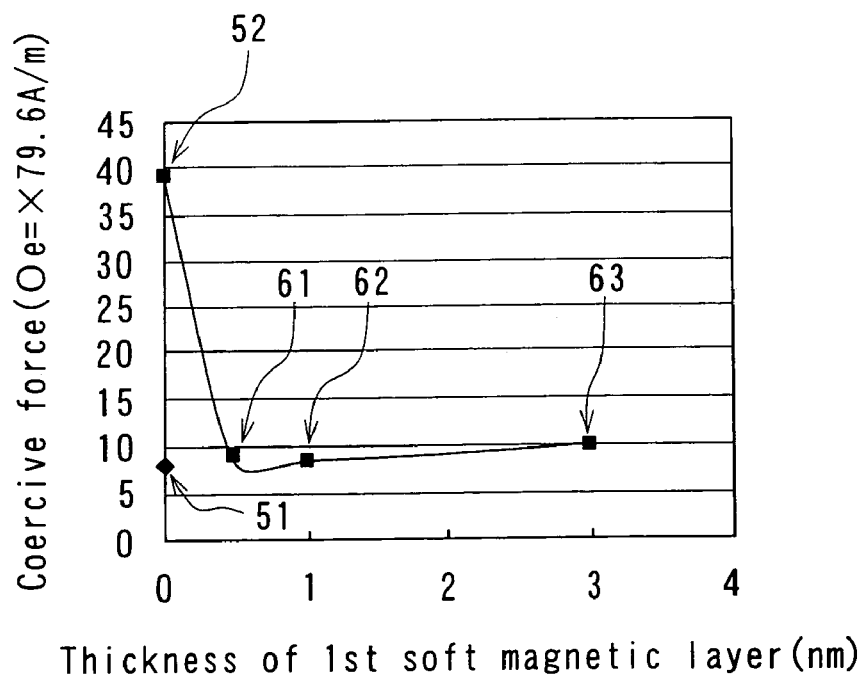
FIG. 11 is a plot showing the results of the first experiment performed to confirm the effects of the MR element of the embodiment of the invention.

Consideration will now be given to a preferable range of thickness of the first soft magnetic layer 41 based on the results of the first experiment. FIG. 10 illustrates the relationship between the thickness of the first soft magnetic layer 41 and the MR ratio obtained from the first experiment results. FIG. 11 illustrates the relationship between the thickness of the first soft magnetic layer 41 and the coercive force of the free layer 25 obtained from the first experiment results. In each of FIG. 10 and FIG. 11, the solid diamond numbered 51 corresponds to the first comparative example, the solid square numbered 52 corresponds to the second comparative example, the solid square numbered 61 corresponds to the first example of the embodiment, the solid square numbered 62 corresponds to the second example of the embodiment, and the solid square numbered 63 corresponds to the third example of the embodiment. The second comparative example corresponds to the case in which the thickness of the first soft magnetic layer 41 is zero.

FIG. 10 shows that, in the 0- to 1-nm range of thickness of the first soft magnetic layer 41, the MR ratio decreases with increasing thickness of the first soft magnetic layer 41. In contrast, in the 1- to 3-nm range of thickness of the first soft magnetic layer 41, the MR ratio hardly decreases with increasing thickness of the first soft magnetic layer 41. It is therefore expected that, in a range in which the thickness of the first soft magnetic layer 41 exceeds 3 nm, too, the MR ratio will hardly decrease with increasing thickness of the soft magnetic layer 41.

FIG. 11 shows that the coercive force of the free layer 25 is greatly reduced when the thickness of the first soft magnetic layer 41 is 0.5 nm, compared with the case in which the thickness thereof is 0 nm. This indicates that the coercive force of the free layer 25 is reduced by the presence of the first soft magnetic layer 41 between the tunnel barrier layer 24 and the high polarization layer 42, even if the thickness of the first soft magnetic layer 41 is very small, compared with the case in which the first soft magnetic layer 41 is not provided. FIG. 11 also shows that, in the 0.5- to 3-nm range of thickness of the first soft magnetic layer 41, the coercive force of the free layer 25 hardly changes with increasing thickness of the first soft magnetic layer 41. It is therefore expected that, in a range in which the thickness of the first soft magnetic layer 41 exceeds 3 nm, too, the coercive force of the free layer 25 will hardly change with increasing thickness of the soft magnetic layer 41.

These findings indicate that the presence of the first soft magnetic layer 41 is essential, no matter how thin it is. However, since it is technically difficult to form the first soft magnetic layer 41 to be extremely thin, it is preferred that the thickness of the first soft magnetic layer 41 be not smaller than 0.2 nm that is close to the minimum possible thickness.

It is expected that making the first soft magnetic layer 41 thicker than 3 nm will not affect the characteristics. However, since it is not practical to make the first soft magnetic layer 41 extremely thick, a thickness of 5 nm or smaller is preferable, and 3 nm or smaller is more preferable, for the first soft magnetic layer 41.

The second experiment will now be described. In the second experiment, coercive force of the free layer was determined for three samples, that is, a fourth example of the embodiment and third and fourth comparative examples. These three samples are different only in details of the free layer. Since the second experiment had the objective of determining the coercive force of the free layer, the layers located closer to the substrate than the tunnel barrier layer were simplified in structure in each of the samples.

Two types of materials, that is, NiFe (82 atomic % Ni and 18 atomic % Fe) and FeCo (45 atomic % Fe and 55 atomic % Co) were used for layers making up the free layer in the second experiment. These materials are hereinafter expressed as $Ni_{82}Fe_{18}$ and $Fe_{45}Co_{55}$, respectively.

The free layer of each of the third and fourth comparative examples is made up of a first layer that is in contact with the tunnel barrier layer and a second layer that is disposed such that the first layer is sandwiched between the tunnel barrier layer and the second layer. The following table lists the materials and thicknesses of the first and second layers of the comparative examples.

TABLE 4

| Sample | 1st layer | 2nd layer |
| --- | --- | --- |
| 3rd comparative example | $Fe_{45}Co_{55}$ 2.0 nm | $Ni_{82}Fe_{18}$ 3.0 nm |
| 4th comparative example | $Fe_{45}Co_{55}$ 2.0 nm | $Ni_{82}Fe_{18}$ 4.0 nm |

The free layer of the fourth example of the embodiment is made up of the first soft magnetic layer, the high polarization layer and the second soft magnetic layer. The following table lists the materials and thicknesses of those three layers of the fourth example of the embodiment.

TABLE 5

| Sample | 1st soft magnetic layer | High polarization layer | 2nd soft magnetic layer |
| --- | --- | --- | --- |
| 4th example of embodiment | $Ni_{82}Fe_{18}$ 1.0 nm | $Fe_{45}Co_{55}$ 2.0 nm | $Ni_{82}Fe_{18}$ 3.0 nm |

The free layer of the fourth comparative example differs from that of the third comparative example in that the second layer made of $Ni_{82}Fe_{18}$ of the fourth comparative example is thicker by 1.0 nm than that of the third comparative example. The free layer of the fourth example of the embodiment can be regarded as having such a structure that a 1.0-nm-thick $Ni_{82}Fe_{18}$ layer is added into the free layer of the third comparative example and disposed between the tunnel barrier layer and the first layer. In such a manner, if consideration is made with reference to the free layer of the third comparative example, it can be said that the free layer of the fourth comparative example and the free layer of the fourth example of the embodiment each have a structure in which a 1.0-nm-thick $Ni_{82}Fe_{18}$ layer is added into the free layer of the third comparative example, but the location at which the additional $Ni_{82}Fe_{18}$ layer is disposed is different. The free layer of the fourth comparative example and the free layer of the fourth example of the embodiment are equal in thickness.

The coercive forces of the free layers determined in the second experiment were: 83.3 Oe (×79.6 A/m) for the third comparative example, 58.6 Oe (×79.6 A/m) for the fourth comparative example, and 4.0 Oe (×79.6 A/m) for the fourth example of the embodiment. This indicates that the coercive force of the free layer is greatly reduced by providing the first soft magnetic layer as in the embodiment of the invention, than by increasing the thickness of the second layer in the case where the free layer is made up of the first and second layers.

Figure 4:
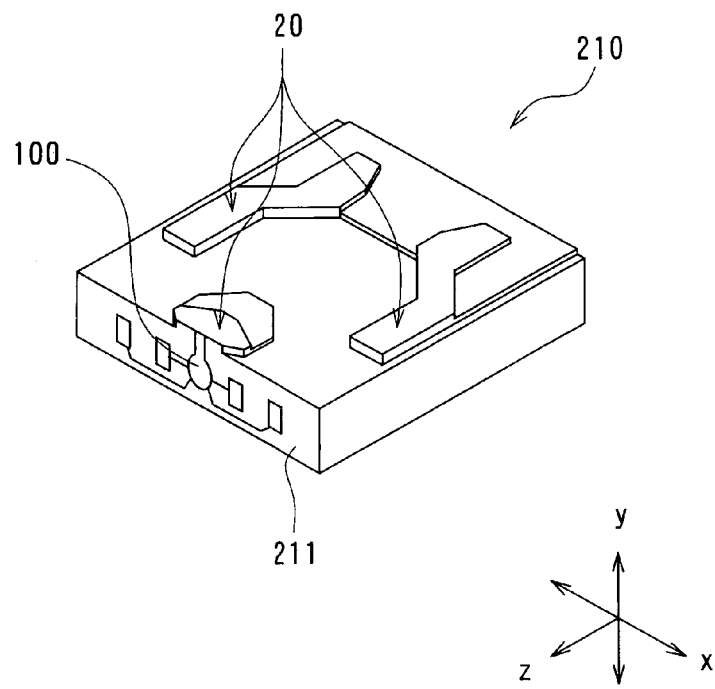
FIG. 4 is a perspective view of a slider incorporated in a head gimbal assembly of the embodiment of the invention.

A head gimbal assembly, a head arm assembly and a magnetic disk drive of the embodiment will now be described. Reference is made to FIG. 4 to describe a slider 210 incorporated in the head gimbal assembly. In the magnetic disk drive, the slider 210 is placed to face toward a magnetic disk platter that is a circular-plate-shaped recording medium to be rotated and driven. The slider 210 has a base body 211 made up mainly of the substrate 1 and the overcoat layer 17 of FIG. 2. The base body 211 is nearly hexahedron-shaped. One of the six surfaces of the base body 211 faces toward the magnetic disk platter. The air bearing surface 20 is formed in this one of the surfaces. When the magnetic disk platter rotates in the z direction of FIG. 4, an airflow passes between the magnetic disk platter and the slider 210, and a lift is thereby generated below the slider 210 in the y direction of FIG. 4 and exerted on the slider 210. The slider 210 flies over the magnetic disk platter by means of the lift. The x direction of FIG. 4 is across the tracks of the magnetic disk platter. The thin-film magnetic head 100 of the embodiment is formed near the air-outflow-side end (the end located at the lower left of FIG. 4) of the slider 210.

Figure 5:
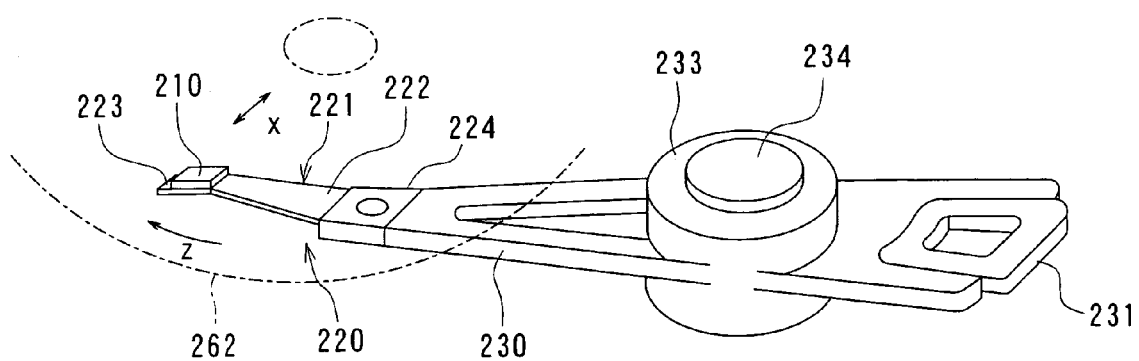
FIG. 5 is a perspective view of a head arm assembly of the embodiment of the invention.

Reference is now made to FIG. 5 to describe the head gimbal assembly 220 of the embodiment. The head gimbal assembly 220 comprises the slider 210 and a suspension 221 that flexibly supports the slider 210. The suspension 221 incorporates: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is designed to be attached to an arm 230 of an actuator for moving the slider 210 along the x direction across the tracks of the magnetic disk platter 262. The actuator incorporates the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly comprising the arm 230 and the head gimbal assembly 220 attached to the arm 230 is called a head arm assembly. An assembly comprising a carriage having a plurality of arms wherein the head gimbal assembly 220 is attached to each of the arms is called a head stack assembly.

FIG. 5 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 6:
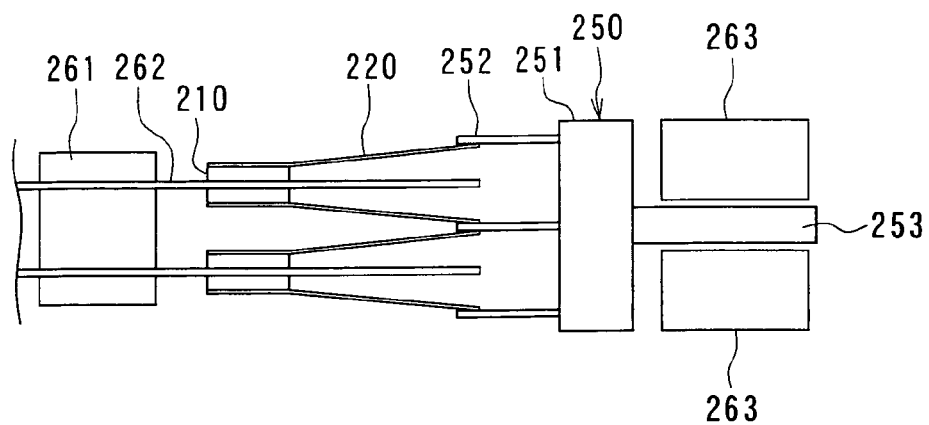
FIG. 6 is a view for illustrating a main part of a magnetic disk drive of the embodiment of the invention.
Figure 7:
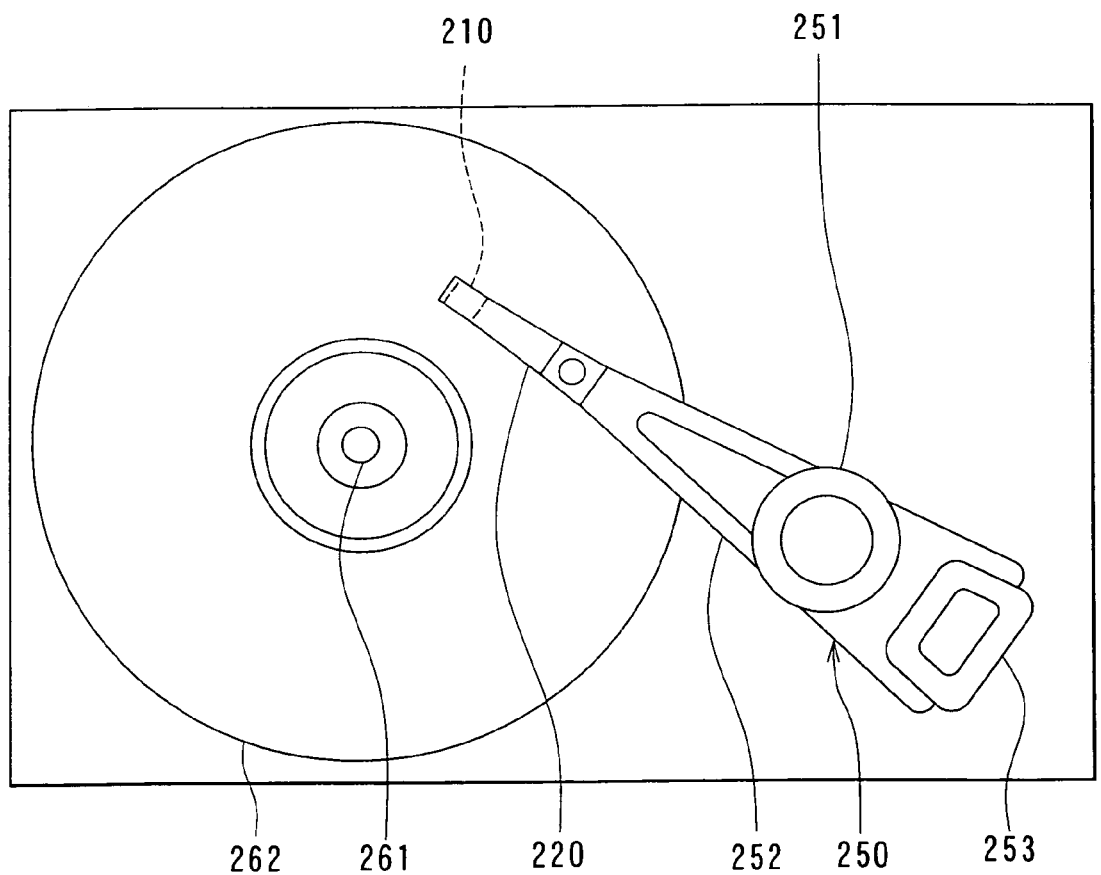
FIG. 7 is a top view of the magnetic disk drive of the embodiment of the invention.

Reference is now made to FIG. 6 and FIG. 7 to describe an example of the head stack assembly and the magnetic disk drive of the embodiment. FIG. 6 illustrates a main part of the magnetic disk drive. FIG. 7 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other such that the coil 253 of the head stack assembly 250 is sandwiched between the magnets 263.

The actuator and the head stack assembly 250 except the sliders 210 correspond to the alignment device of the invention and support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 through the use of the write head and reads data stored on the magnetic disk platter 262 through the use of the read head.

The head gimbal assembly, the head arm assembly and the magnetic disk drive of the embodiment exhibit effects similar to those of the foregoing thin-film magnetic head of the embodiment.

The present invention is not limited to the foregoing embodiment but may be practiced in still other ways. For example, for the free layer of the magnetoresistive element of the invention, it is sufficient as long as at least the first soft magnetic layer, the high polarization layer and the second soft magnetic layer are incorporated. Accordingly, another layer may be provided between the above-mentioned layers or on a surface of the second soft magnetic layer farther from the high polarization layer.

The thin-film magnetic head described in the foregoing embodiment has a structure in which the read head is formed on the base body and the write head stacked on the read head. Alternatively, the read head may be stacked on the write head.

The thin-film magnetic head may comprise the read head only when designed for reading only.

The magnetoresistive element of the invention is applicable not only to a read head of a thin-film magnetic head but also to other devices such as a magnetic sensor.

Obviously many modifications and variations of the present invention are possible in the light of the above teachings. It is therefore to be understood that within the scope of the appended claims the invention may be practiced otherwise than as specifically described.

What is claimed is:

1. A magnetoresistive element comprising:
   a tunnel barrier layer having two surfaces that face toward opposite directions;
   a free layer disposed adjacent to one of the surfaces of the tunnel barrier layer and having a direction of magnetization that changes in response to an external magnetic field; and
   a pinned layer that is a ferromagnetic layer disposed adjacent to the other of the surfaces of the tunnel barrier layer and having a fixed direction of magnetization, wherein:
   the free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers;
   the high polarization layer is a ferromagnetic layer having a spin polarization higher than that of each of the first and second soft magnetic layers; and
   each of the first and second soft magnetic layers is a ferromagnetic layer having a coercive force lower than that of the high polarization layer.

2. A magnetoresistive element according to claim 1, wherein the high polarization layer is made of any one of iron, an alloy containing iron, and an alloy containing iron and cobalt.

3. A magnetoresistive element according to claim 1, wherein the high polarization layer is made of an alloy containing M atomic % iron and (100−M) atomic % cobalt, where M is equal to or greater than 40 and smaller than 100.

4. A magnetoresistive element according to claim 1, wherein each of the first and second soft magnetic layers is made of any one of nickel, iron, and an alloy containing at least one of nickel and iron.

5. A magnetoresistive element according to claim 1, wherein each of the first and second soft magnetic layers has a coercive force of 5×79.6 A/m or less.

6. A magnetoresistive element according to claim 1, wherein the first soft magnetic layer has a thickness that is not smaller than 0.2 nm and not greater than 5 nm.

7. A magnetoresistive element according to claim 1, wherein the first soft magnetic layer has a thickness that is not smaller than 0.2 nm and not greater than 3 nm.

8. A thin-film magnetic head comprising: a medium facing surface that faces toward a recording medium; and a magnetoresistive element disposed near the medium facing surface for detecting a signal magnetic field sent from the recording medium, wherein:

the magnetoresistive element comprises:

a tunnel barrier layer having two surfaces that face toward opposite directions;

a free layer disposed adjacent to one of the surfaces of the tunnel barrier layer and having a direction of magnetization that changes in response to an external magnetic field; and a pinned layer that is a ferromagnetic layer disposed adjacent to the other of the surfaces of the tunnel barrier layer and having a fixed direction of magnetization;

the free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers;

the high polarization layer is a ferromagnetic layer having a spin polarization higher than that of each of the first and second soft magnetic layers; and each of the first and second soft magnetic layers is a ferromagnetic layer having a coercive force lower than that of the high polarization layer.

9. A head gimbal assembly comprising: a slider incorporating a thin-film magnetic head and disposed to face toward a recording medium; and a suspension that flexibly supports the slider, wherein:

the thin-film magnetic head comprises: a medium facing surface that faces toward the recording medium; and a magnetoresistive element disposed near the medium facing surface for detecting a signal magnetic field sent from the recording medium;

the magnetoresistive element comprises:

a tunnel barrier layer having two surfaces that face toward opposite directions;

a free layer disposed adjacent to one of the surfaces of the tunnel barrier layer and having a direction of magnetization that changes in response to an external magnetic field; and a pinned layer that is a ferromagnetic layer disposed adjacent to the other of the surfaces of the tunnel barrier layer and having a fixed direction of magnetization;

the free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers;

the high polarization layer is a ferromagnetic layer having a spin polarization higher than that of each of the first and second soft magnetic layers; and each of the first and second soft magnetic layers is a ferromagnetic layer having a coercive force lower than that of the high polarization layer.

10. A head arm assembly comprising: a slider incorporating a thin-film magnetic head and disposed to face toward a recording medium; a suspension that flexibly supports the slider; and an arm for moving the slider in a direction across tracks of the recording medium, the suspension being attached to the arm, wherein:

the thin-film magnetic head comprises: a medium facing surface that faces toward the recording medium; and a magnetoresistive element disposed near the medium facing surface for detecting a signal magnetic field sent from the recording medium;

the magnetoresistive element comprises:

a tunnel barrier layer having two surfaces that face toward opposite directions;

a free layer disposed adjacent to one of the surfaces of the tunnel barrier layer and having a direction of magnetization that changes in response to an external magnetic field; and a pinned layer that is a ferromagnetic layer disposed adjacent to the other of the surfaces of the tunnel barrier layer and having a fixed direction of magnetization;

the free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers;

the high polarization layer is a ferromagnetic layer having a spin polarization higher than that of each of the first and second soft magnetic layers; and each of the first and second soft magnetic layers is a ferromagnetic layer having a coercive force lower than that of the high polarization layer.

11. A magnetic disk drive comprising: a slider incorporating a thin-film magnetic head and disposed to face toward a circular-plate-shaped recording medium that is rotated and driven; and an alignment device that supports the slider and aligns the slider with respect to the recording medium, wherein:

the thin-film magnetic head comprises: a medium facing surface that faces toward the recording medium; and a magnetoresistive element disposed near the medium facing surface for detecting a signal magnetic field sent from the recording medium;

the magnetoresistive element comprises:

a tunnel barrier layer having two surfaces that face toward opposite directions;

a free layer disposed adjacent to one of the surfaces of the tunnel barrier layer and having a direction of magnetization that changes in response to an external magnetic field; and a pinned layer that is a ferromagnetic layer disposed adjacent to the other of the surfaces of the tunnel barrier layer and having a fixed direction of magnetization;

the free layer incorporates: a first soft magnetic layer disposed adjacent to the one of the surfaces of the tunnel barrier layer; a high polarization layer disposed such that the first soft magnetic layer is sandwiched between the tunnel barrier layer and the high polarization layer; and a second soft magnetic layer disposed such that the high polarization layer is sandwiched between the first and second soft magnetic layers;

the high polarization layer is a ferromagnetic layer having a spin polarization higher than that of each of the first and second soft magnetic layers; and each of the first and second soft magnetic layers is a ferromagnetic layer having a coercive force lower than that of the high polarization layer.

* * * * *